US012628375B2

(12) United States Patent
Xie et al.

(10) Patent No.: US 12,628,375 B2
(45) Date of Patent: May 12, 2026

(54) NANOSHEET TRANSISTOR WITH ASYMMETRIC JUNCTION AND ROBUST STRUCTURE STABILITY

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 662 days.

(21) Appl. No.: 17/489,751

(22) Filed: Sep. 29, 2021

(65) Prior Publication Data

US 2023/0095447 A1     Mar. 30, 2023

(51) Int. Cl.
| | |
|---|---|
| *H10D 30/67* | (2025.01) |
| *H10D 30/01* | (2025.01) |
| *H10D 62/10* | (2025.01) |

(52) U.S. Cl.
CPC ....... *H10D 30/6729* (2025.01); *H10D 30/031* (2025.01); *H10D 30/6728* (2025.01); *H10D 30/6735* (2025.01); *H10D 62/118* (2025.01)

(58) Field of Classification Search
None
See application file for complete search history.

(56) References Cited

U.S. PATENT DOCUMENTS

| | | | |
|---|---|---|---|
| 7,396,713 B2 | 7/2008 | Yang | |
| 9,362,355 B1 | 6/2016 | Cheng et al. | |
| 9,570,551 B1 * | 2/2017 | Balakrishnan | ......... B82Y 10/00 |
| 9,842,914 B1 | 12/2017 | Yeung et al. | |
| 9,923,055 B1 | 3/2018 | Cheng | |

(Continued)

FOREIGN PATENT DOCUMENTS

| | | |
|---|---|---|
| CN | 106449755 A | 2/2017 |

OTHER PUBLICATIONS

Kim, H. W., & Kwon, D. (2020). Analysis on Tunnel Field-Effect Transistor with Asymmetric Spacer. Applied Sciences, 10(9), 3054.

(Continued)

*Primary Examiner* — Brent A. Fairbanks
*Assistant Examiner* — Derek L Nielsen
(74) *Attorney, Agent, or Firm* — Harrity & Harrity, LLP

(57) ABSTRACT

A semiconductor structure includes a substrate; bottom dielectric isolation (BDI) on the substrate; a first source/drain region on the BDI; and a nanosheet stack on the BDI. The nanosheet stack includes gate stack layers; semiconductor nanosheets interleaved with the gate stack layers and contacting the first source/drain region; and first inner spacers adjacent to the first source/drain region and separating the first source/drain region from the gate stack layers. The structure also includes a second source/drain region contacting the semiconductor nanosheet and extending from the top of the nanosheet stack down through the BDI to the substrate. Accordingly, the nanosheet stack also includes second inner spacers in the nanosheet stack adjacent to the second source/drain region and separating the second source/drain region from the gate stack layers.

19 Claims, 4 Drawing Sheets

(56) References Cited

U.S. PATENT DOCUMENTS

| | | |
|---|---|---|
| 10,134,859 B1 | 11/2018 | Bi et al. |
| 10,170,638 B1 * | 1/2019 | Reznicek ............. H10D 62/151 |
| 10,229,983 B1 | 3/2019 | Bu et al. |
| 10,516,028 B2 | 12/2019 | Bi |
| 10,553,696 B2 | 2/2020 | Ando |
| 2019/0140064 A1 * | 5/2019 | Bi ........................ H10D 30/603 |

OTHER PUBLICATIONS

Pal, P. K., Kaushik, B. K., & Dasgupta, S. (2013). High-performance and robust SRAM cell based on asymmetric dual-k spacer FinFETs. IEEE Transactions on Electron Devices, 60(10), 3371-3377.
Ryu, D. (2019). Spacer Optimization from Gate-Induced Drain Leakage Perspective in 3-nm Node Device. Doctoral dissertation, department of electrical and computer engineering, Seoul National University.
Barraud et al., "7-Levels-Stacked Nanosheet GAA Transistors for High Performance Computing", IEEE symposium on VLSI technology. IEEE, 2020, 2 pages.

* cited by examiner

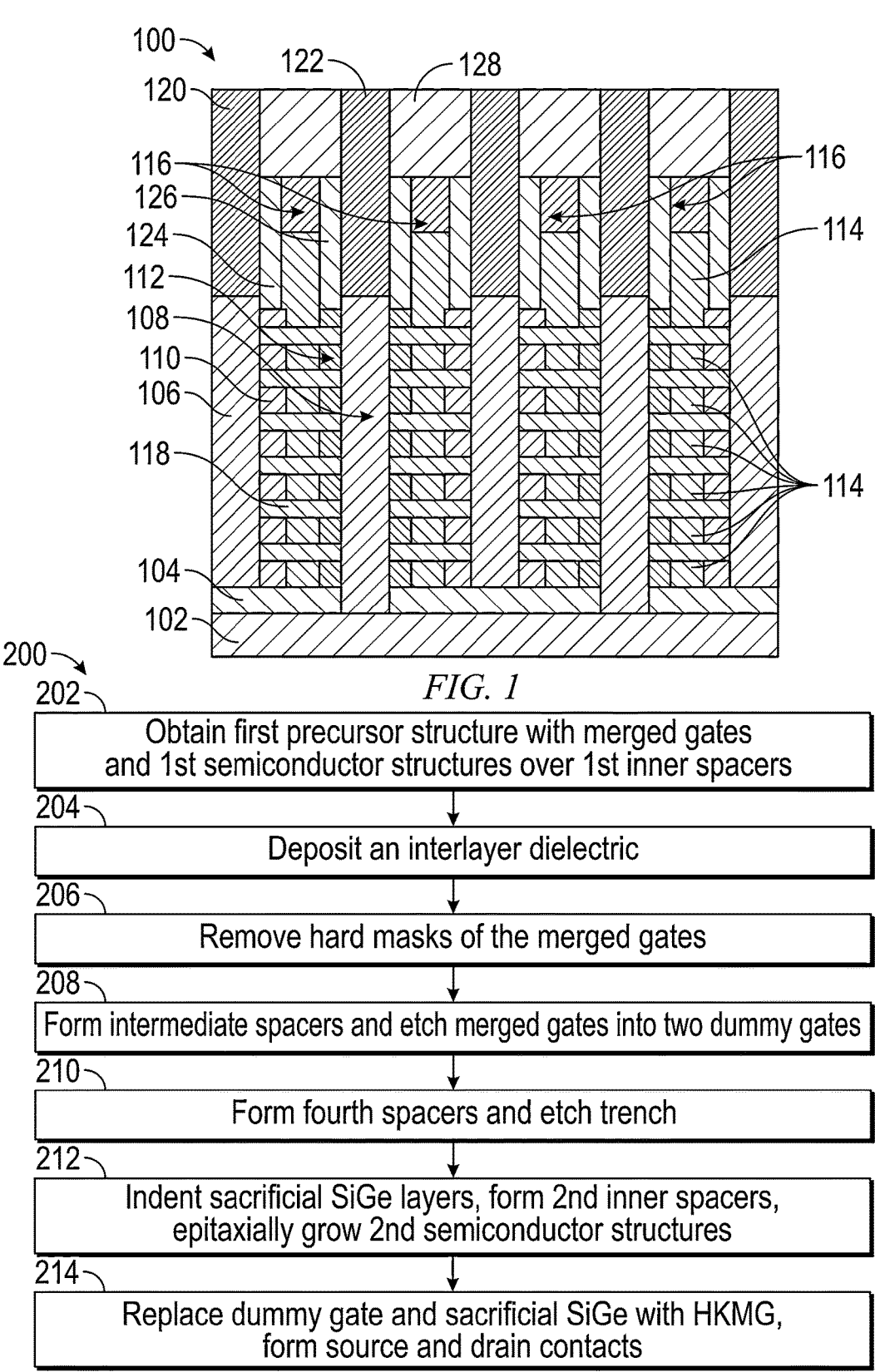

| Obtain first precursor structure with merged gates and 1st semiconductor structures over 1st inner spacers |

204

| Deposit an interlayer dielectric |

206

| Remove hard masks of the merged gates |

208

| Form intermediate spacers and etch merged gates into two dummy gates |

210

| Form fourth spacers and etch trench |

212

| Indent sacrificial SiGe layers, form 2nd inner spacers, epitaxially grow 2nd semiconductor structures |

214

| Replace dummy gate and sacrificial SiGe with HKMG, form source and drain contacts |

NANOSHEET TRANSISTOR WITH ASYMMETRIC JUNCTION AND ROBUST STRUCTURE STABILITY

BACKGROUND

The present invention relates to the electrical, electronic, and computer arts, and more specifically, to nanosheet stack semiconductor structures.

As semiconductor technology scales to smaller dimension nodes (e.g., 23 nm process to 7 nm process), increasing cell density requires increased cell height. During fabrication, taller, narrower new stacks are less mechanically stable than shorter, wider old stacks. Mechanical stability during fabrication enhances quality of fabrication results.

Smaller dimension/denser semiconductor cells have increased leakage currents due to the smaller distance, and therefore smaller resistance, through the substrate between the source and the drain. Bottom dielectric isolation (BDI) sometimes is interposed between the source and drain and the semiconductor substrate in order to isolate the source and drain from the substrate. However, BDI interposition has the result that the semiconductor no longer can be grown epitaxially from the substrate. S/D Epitaxial growth from substrate enhances crystal structure (fewer defects) and potentially can introduce stress to the channel and thereby enhances electrical performance.

SUMMARY

Principles of the invention provide techniques for an asymmetric nanosheet transistor junction with robust structure stability. In one aspect, an exemplary semiconductor structure, according to an aspect of the invention, includes a substrate; bottom dielectric isolation (BDI) on the substrate; and a nanosheet stack on the BDI. The nanosheet stack includes gate stack layers and semiconductor nanosheets interleaved with the gate stack layers. The structure also includes a first source/drain region on the BDI, adjacent to and contacting the nanosheet stack; and a second source/drain region extending from the top of the nanosheet stack down through the BDI to the substrate, adjacent to and contacting the nanosheet stack.

Another aspect provides an exemplary semiconductor structure, which includes a substrate; bottom dielectric isolation (BDI) on the substrate; a first source/drain region on the BDI; and a nanosheet stack on the BDI. The nanosheet stack includes gate stack layers; semiconductor nanosheets interleaved with the gate stack layers and contacting the first source/drain region; and first inner spacers adjacent to the first source/drain region and separating the first source/drain region from the gate stack layers. The structure also includes second source/drain region contacting the semiconductor nanosheet and extending from the top of the nanosheet stack down through the BDI to the substrate. Accordingly, the nanosheet stack also includes second inner spacers in the nanosheet stack adjacent to the second source/drain region and separating the second source/drain region from the gate stack layers.

Another aspect provides a method, which includes, at, obtaining a first precursor structure. The first precursor structure includes a substrate; a bottom dielectric isolation (BDI) on the substrate; a first source/drain region on the BDI; a nanosheet stack of fins and sacrificial silicon germanium (SiGe) layers, disposed next to the first source/drain region; a dummy gate disposed on top of the nanosheet stack; a hard mask disposed on top of the dummy gate; and first gate spacers disposed at either side of the hard mask and the dummy gate. The first gate spacers and the dummy gate entirely occupy a top of the nanosheet stack. The method also includes, at, depositing an interlayer dielectric onto the first precursor structure; at, etching the hard mask; and at, forming intermediate spacers on the dummy gates and then etching the dummy gates between the intermediate spacers to form a trench.

In view of the foregoing, techniques of the present invention can provide substantial beneficial technical effects. For example, one or more embodiments provide one or more of:

A nanosheet stacked transistor junction precursor that exhibits robust structural stability during fabrication.

A nanosheet stacked transistor junction with asymmetry between source and drain substrate connection, which improves electrical performance.

A nanosheet stacked transistor junction with asymmetry between source side spacers and drain side spacers, which improves electrical performance.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 1 depicts a nanosheet transistor junction, according to an exemplary embodiment.

FIG. 2 depicts a flowchart of a process for fabricating the transistor junction shown in FIG. 1, according to an exemplary embodiment.

Figures 5, 6:
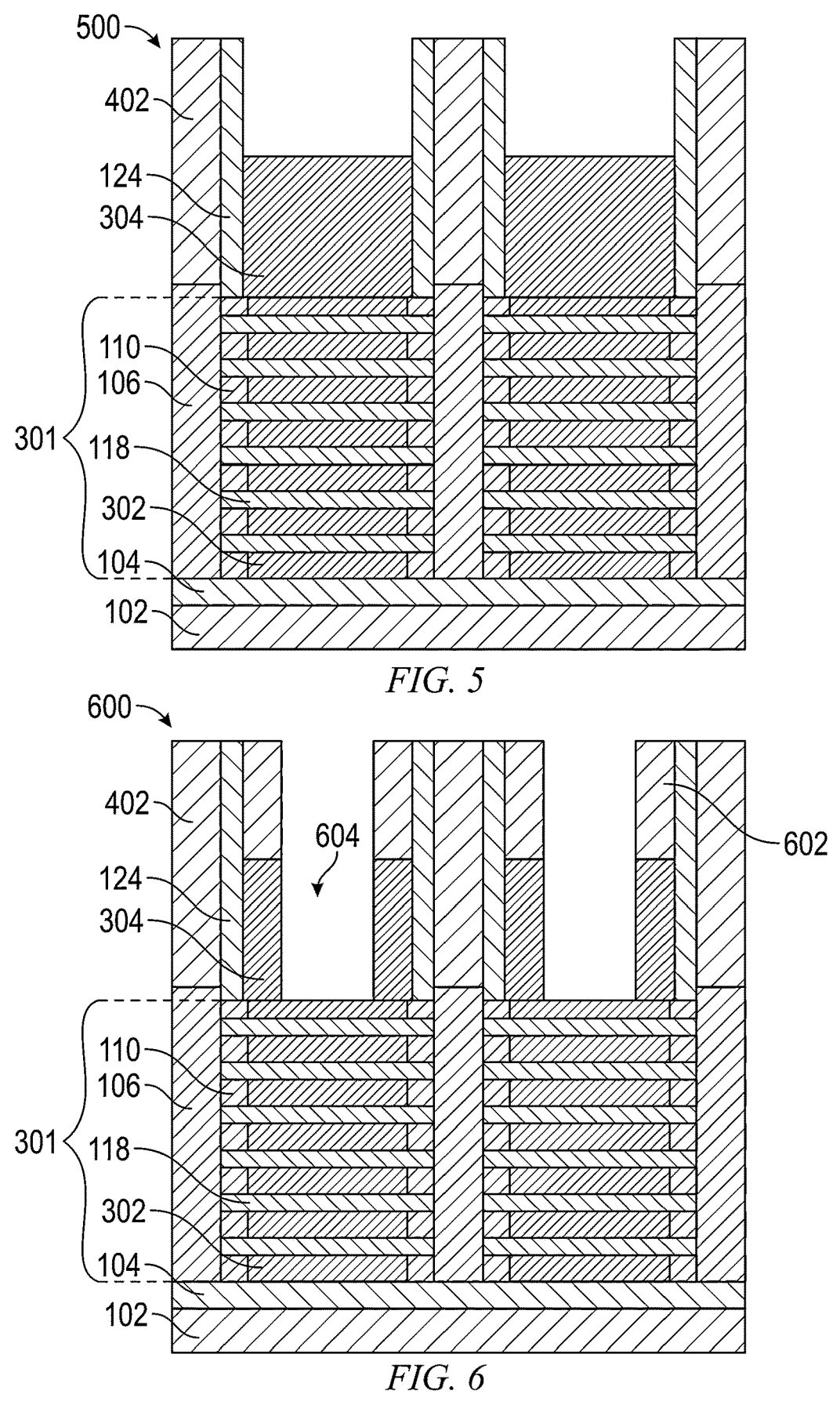

FIG. 5 depicts a third precursor structure according to the process of FIG. 2.

FIG. 6 depicts a fourth precursor structure according to the process of FIG. 2.

DETAILED DESCRIPTION

Figures 3, 4:
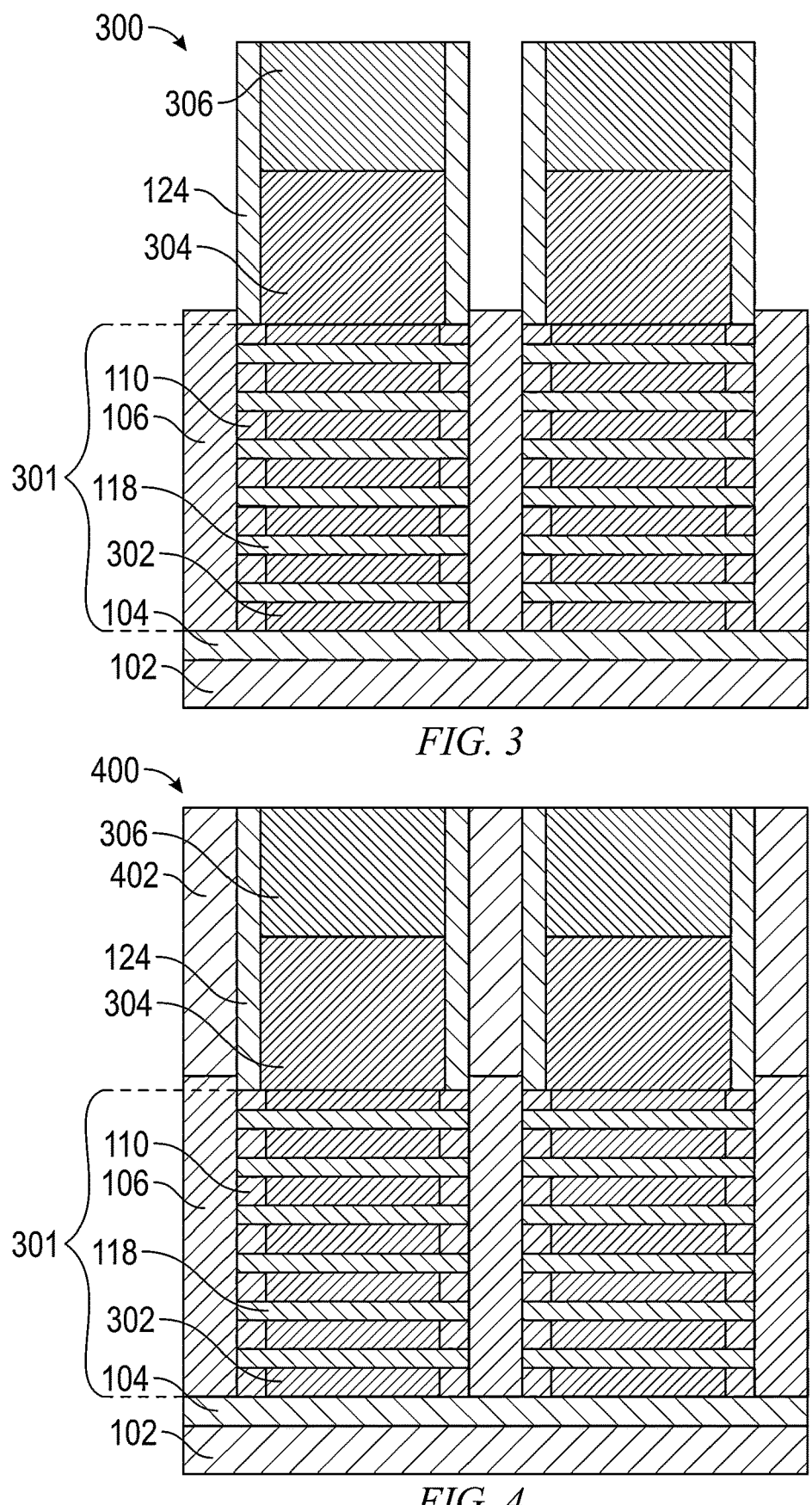
FIG. 3 depicts a first precursor structure according to the process of FIG. 2.
FIG. 4 depicts a second precursor structure according to the process of FIG. 2.
Figures 7, 8:
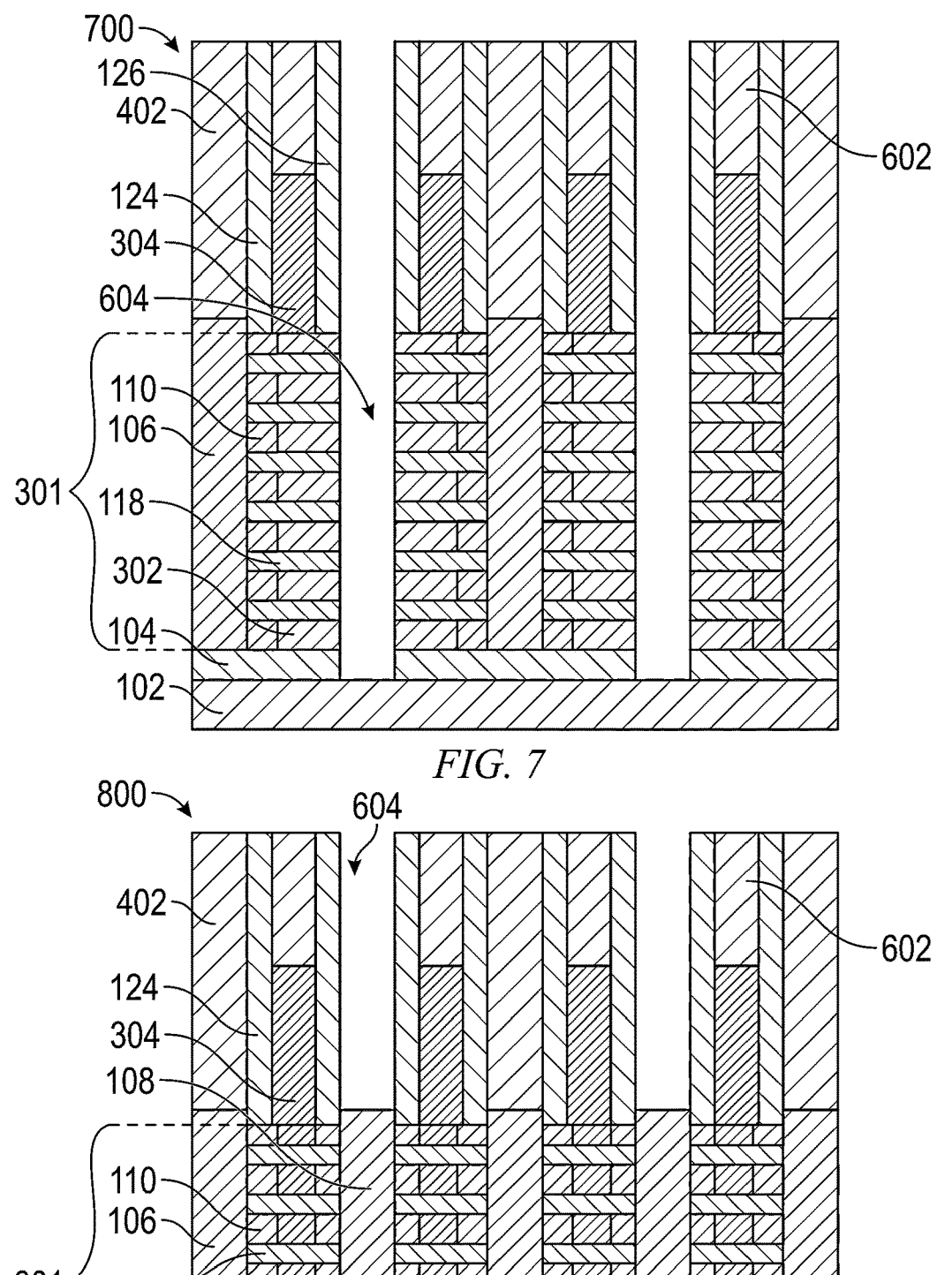
FIG. 7 depicts a fifth precursor structure according to the process of FIG. 2.
FIG. 8 depicts a sixth precursor structure according to the process of FIG. 2.

FIG. 1 depicts a nanosheet transistor structure 100, according to exemplary embodiments. In one or more embodiments, the structure 100 may be asymmetric, which will be further explained in detail below.

The structure 100 includes a substrate 102, bottom dielectric isolation (BDI) 104 on the substrate 102, first source/drain structures 106 on the BDI 104, second source/drain structures 108 on the substrate 102, first inner spacers 110 adjacent to the first source/drain regions with first dielectric constant and first spacer width, second inner spacers 112 adjacent to the second source/drain regions with second dielectric constant and second width, high-k metal gate (HKMG) material 114 wrapping around nanosheet channels 118, a gate 115 atop the nanosheet channels 118, a self-aligned contact (SAC) gate dielectric cap 116 atop the gate 115, and semiconductor nanosheets 118 interleaved between the gate material 114. In one or more embodiments, the structure 100 further includes drain contacts 120 that are connected with the first source/drain structures 106, source contacts 122 that are connected with the second source/drain structures 108, and first and second gate spacers 124, 126 that electrically separate the gate 115 from the first and second contacts 120, 122. An interlayer dielectric (ILD) 128 is provided on the structure 100. In operation, application of gate voltage to the gate material 114, via the gate 115, creates inversion carriers in channels 118 so that current can flow between the first structures 106 and the second structures 108.

In one or more embodiments, materials for the semiconductor (drain and source) structures 106, 108 and the nanosheet 118 may include, by way of non-limiting example, silicon (Si), silicon germanium (SiGe), or other suitable semiconductors undoped, or doped with n- or p-impurities. In one or more embodiments, materials for the inner spacers 110, 112 and for the first and second gate spacers 124, 126 may include, by way of non-limiting example, hafnium oxide (HfO), zirconium oxide (ZrO), or titanium oxide (TiO), SiN, SiBCN, SiOCN, SiOC, SiC, etc. In one or more embodiments, the HKMG 114 may be, by way of non-limiting example, high-k dielectric layer, such as HfO2, ZrO2, HfAlOx, HfSiOx, TaOx, HfTaOx, HfLaOx, etc., and work function metals (WFM), such as TiN, TiC, TiAlC, TiAl, TaN, etc., and optionally conductive metal fills such as W, Al, Ru, etc.). In one or more embodiments, the self-aligned contacts 120, 122 are metals including a silicide at bottom between the contact and S/D epi, such as Ti silicide, Ni silicide or NiPt silicide, followed by a thin adhesion layer such as TiN and low resistance metal fill such as Co, W, Ru, etc.; in other embodiments, the contacts are an alternative metal such as Mo and carbon nanotubes.

An epitaxial deposition process, as used at least for fabricating the nanosheets 118 and the source/drain epi structure 108/106, may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

Work function metal (WFM) layers are disposed over the gate dielectric layer in both the nFET and pFET regions (in embodiments having both types of regions) to complete the gate stacks. Non-limiting examples of suitable work function (gate) metals include p-type work function metal materials and n-type work function metal materials. P-type work function materials include compositions such as ruthenium, palladium, platinum, cobalt, nickel, and conductive metal nitride like TiN, WN, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

The work function metal(s) may be deposited by a suitable deposition process, for example, ALD, CVD, PECVD, PVD, plating, and thermal or e-beam evaporation. Pinch-off of work function metal material between semiconductor fins is essentially avoided during deposition. The WFM layer is removed from one of the nFET and pFET regions in structures including both types of regions while the other region is protected. An SC1 etch, an SC2 etch or other suitable etch processes can be employed to remove the selected portion of the originally deposited WFM layer. A new WFM layer suitable for the region is then deposited. A device formed in the nFET region will accordingly include a WFM layer (gate electrode) having a first composition while a device in the pFET region will have a WFM layer having a second composition. For example, the WFM employed in an nFET region may be a Ti, Al, TiAl, TiAlC or TiAlC layer or a metal stack such as TiN/TiAl/TiN, TiN/TiAlC/TiN, TiN/TaAlC/TiN, or any combination of an aluminum alloy and TiN layers. The WFM layer employed in the pFET region may, for example, be a TiN, TiC, TaN or a tungsten (W) layer. The threshold voltage (Vt) of nFET devices is sensitive to the thickness of work function metals such as titanium nitride (TiN).

In some embodiments, the SAC cap 116 may be SiN deposited over the recessed HKMG 114 by, for example, CVD, PECVD, PVD, plating, thermal or e-beam evaporation, or sputtering. A planarization process such as CMP is performed to remove any excessive material (overburden) from the top surface of the structure.

For reasons further discussed below, in one or more embodiments the first source-drain structures 106 and their corresponding contacts 120 are connected as the drain terminal of the transistor (element 106 referred to as "drain" below) and the second source-drain structures 108 and their corresponding contacts 122 are connected as the source terminal of the transistor (element 108 referred to as "source" below). As further discussed below, in one or more embodiments the second inner spacers 112 may be of different dielectric constant k, or of different width, or both, compared to the first inner spacers 110. In particular embodiments, the second inner spacers 112 may be thinner, and/or have a higher k-value (dielectric constant), compared to the first inner spacers 110.

In one or more embodiments, it is desirable to provide the BDI 104, in order to reduce leakage current through the substrate. In one or more embodiments, the BDI 104 is interposed between the structures 106 and the substrate 102. Therefore, the structures 106 cannot be epitaxially grown from the substrate, but rather are grown from the exposed sidewalls of nanosheets 118. On the other hand, the BDI 104 is not interposed between the structures 108 and the substrate 102. Therefore, as further discussed below, the structures 108 can be epitaxially grown from the substrate 102. An ordinary skilled worker will appreciate that a crystal structure grown from multiple seeds (i.e. the structures 106 grown from multiple nanosheets 118) will have more imperfections or defects than will a crystal structure grown from a single seed (i.e. the structures 108 grown epitaxially from the substrate 102). We have also found that it is only necessary to interpose the BDI 104 between the substrate 102 and at least one of the source 108 or the drain 106. We have determined that it is advantageous to grow the source 108 epitaxially and have the BDI 104 interposed between the substrate 102 and the drain 106, because crystal defects affect conduction more in the source 108 than in the drain 106. Having the BDI 104 between the drain 106 and the substrate 102, but not between the source 108 and the substrate 102, introduces source/drain asymmetry into the nanosheet transistor structure. The source/drain asymmetry advantageously permits the source 108 to be grown epitaxially, which advantageously enables the overall structure 100 to exhibit higher "on" current than would be achievable if the asymmetry were not present or were reversed.

In one or more embodiments, additional asymmetry can be introduced by varying the widths/thicknesses and/or dielectric constants (k-values) of the first and second inner spacers 110, 112. Giving the first spacers 110 greater widths and/or lower k-values than the second inner spacers 112 advantageously optimizes capacitance in the structure and thereby makes it easier to accumulate charges at source side 108 and minimize unwanted parasitic capacitance at drain side 106. Thus, spacer asymmetry can be advantageous in a nanosheet transistor structure.

The asymmetries in the transistor structure 100 are enabled by a process 200, shown in FIG. 2, which produces precursor structures shown in FIG. 3 through FIG. 8. The process 200 advantageously enables source/drain asymmetry and spacer asymmetry that are not achievable by known processes.

The process 200 begins at 202, with obtaining a first precursor structure 300 (shown in FIG. 3). The first precursor structure 300 includes the substrate 102, the bottom dielectric isolation (BDI) 104, the first source/drain regions 106, the first inner spacers 110, a nanosheet stack 301 of the nanosheets 118 and sacrificial silicon germanium (SiGe) layers 302, merged (or fat) dummy gates 304, hard masks 306, and the first gate spacers 124. At 204, produce a second precursor structure 400 (shown in FIG. 4) by depositing an interlayer dielectric 402 onto the first precursor structure 300, followed by CMP process to remove any overburden of the ILD 402 on top of hardmask 306. At 206, produce a third precursor structure 500 (shown in FIG. 5) by selectively removing the hard masks 306 by dry or wet etch process. At 208, produce a fourth precursor structure 600 (shown in FIG. 6) by forming intermediate spacers 602 on the merged dummy gates 304 and then etching the merged dummy gates between the intermediate spacers 602 to form a trench 604, and split the fat dummy gates into two dummy gates with smaller CD.

At 210, in one or more embodiments, produce a fifth precursor structure 700 (shown in FIG. 7) by forming the second gate spacers 126 and further etching the trench 604 between the second gate spacers 126, through the nanosheet stack 301 and the BDI 104, down to the substrate 102. At 212, in one or more embodiments, produce a sixth precursor structure 800 (shown in FIG. 8) by indenting the sacrificial SiGe layers 302 from the trench 604, forming the second inner spacers 112 in the indentations of the layers 302, and epitaxially growing the second source-drain structures 108 from the substrate 102 in the trenches 604. At 214, complete the nanosheet transistor structure 100 by replacing the sacrificial SiGe layers 302 and the dummy gate 304 with HKMG material 114, forming SAC cap 116, and forming the ILD 128 and source and drain contacts 120, 122, according to typical processes.

Given the discussion thus far, it will be appreciated that, in general terms, an exemplary semiconductor structure 100, according to an aspect of the invention, includes a substrate 102; bottom dielectric isolation (BDI) 104 on the substrate; and a nanosheet stack 301 on the BDI. The nanosheet stack includes gate stack layers 114; and semiconductor nanosheets 118 interleaved with the gate stack layers. The structure 100 also includes a first source/drain region 106 on the BDI, adjacent to and contacting the nanosheet stack; and a second source/drain region 108 extending from the top of the nanosheet stack down through the BDI to the substrate, adjacent to and contacting the nanosheet stack.

In one or more embodiments, the structure 100 also includes first dielectric spacers 110 adjacent to the first source/drain region and separating the first source/drain region from the gate stack layers.

In one or more embodiments, the structure 100 also includes second dielectric spacers 112 adjacent to the second source/drain region and separating the second source/drain region from the gate stack layers.

In one or more embodiments, the first and second dielectric spacers comprise high-k dielectric material. In one or more embodiments, the gate stack layers comprise high-k dielectric material.

In one or more embodiments, the semiconductor structure forms a field effect transistor (FET) with a gate 115 atop the gate stack layers 114.

Another aspect provides an exemplary semiconductor structure 100, which includes a substrate 102; bottom dielectric isolation (BDI) 104 on the substrate; a first source/drain region 106 on the BDI; and a nanosheet stack 301 on the BDI. The nanosheet stack includes gate stack layers 114; semiconductor nanosheets 118 interleaved with the gate stack layers and contacting the first source/drain region; and first inner spacers 110 adjacent to the first source/drain region and separating the first source/drain region from the gate stack layers. The structure 100 also includes second source/drain region 108 contacting the semiconductor nanosheet and extending from the top of the nanosheet stack down through the BDI to the substrate. Accordingly, the nanosheet stack 301 also includes second inner spacers 112 in the nanosheet stack adjacent to the second source/drain region and separating the second source/drain region from the gate stack layers.

In one or more embodiments, the structure 100 also includes a drain metal contact 120 that contacts the first source/drain region.

In one or more embodiments, the first inner spacers and second inner spacers are high-k material.

In one or more embodiments, the structure 100 also includes a source metal contact 122 that contacts the second source/drain region.

In one or more embodiments, the structure 100 also includes first and second gate dielectric spacers 124, 126 that electrically separate the gates from the first and second metal contacts.

In one or more embodiments, the second inner spacers are of different dielectric constant k, compared to the first inner spacers.

In one or more embodiments, the second inner spacers are of different width, compared to the first inner spacers.

In one or more embodiments, the second high-k spacers are thinner compared to the first high-k spacers.

In one or more embodiments, the second high-k spacers have a higher k-value, compared to the first high-k spacers.

Another aspect provides a method 200, which includes, at 202, obtaining a first precursor structure. The first precursor structure includes a substrate; a bottom dielectric isolation (BDI) on the substrate; a first source/drain region on the BDI; a nanosheet stack of fins and sacrificial silicon germanium (SiGe) layers, disposed next to the first source/drain region; a dummy gate disposed on top of the nanosheet stack; a hard mask disposed on top of the dummy gate; and first gate spacers disposed at either side of the hard mask and the dummy gate. The first gate spacers and the dummy gate entirely occupy a top of the nanosheet stack. The method 200 also includes, at 204, depositing an interlayer dielectric (ILD) onto the first precursor structure; chemical mechanical polishing to remove any overburden of the ILD on top of hardmask; at 206, etching the hard mask; and at 208, forming intermediate spacers on the dummy gates and then etching the dummy gates between the intermediate spacers to form a trench that splits the dummy gates into pairs of smaller dummy gates.

In one or more embodiments, the method 200 also includes, at 210, forming second gate spacers on inner sides of the trench and further etching the trench between the second gate spacers, through the nanosheet stack and the BDI, down to the substrate.

In one or more embodiments, the method 200 also includes, at 212, indenting the sacrificial SiGe layers from the trench and forming second spacers in the indentations of the SiGe layers.

In one or more embodiments, the method 200 also includes, at 212, epitaxially growing a second structure from the substrate in the trench.

In one or more embodiments, the method 200 also includes, at 214, replacing the sacrificial SiGe layers and the dummy gate with HKMG material; forming an SAC cap on the HKMG material; and forming first and second metal contacts and an interlayer dielectric.

Embodiments of the invention involve and relate to semiconductor device fabrication. Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures.

A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, for example epitaxial deposition, that forms the doped layer. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

As used herein, the term "conductivity type" denotes a dopant region being p-type or n-type. As further used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. Examples of n-type dopants, i.e., impurities in a silicon-containing substrate include but are not limited to antimony, arsenic and phosphorous.

As an exemplary subtractive process, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist)

portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (ME), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a substrate;
bottom dielectric isolation (BDI) on the substrate;
a nanosheet stack on the BDI, the nanosheet stack comprising:
gate stack layers; and semiconductor nanosheets interleaved with the gate stack layers;
a first source/drain region on the BDI, adjacent to and contacting the nanosheet stack;
a second source/drain region extending from the top of the nanosheet stack down through the BDI to the substrate, adjacent to and contacting the nanosheet stack; and
dielectric spacers on opposite sides of the gate stack layers, wherein the dielectric spacers have asymmetry in terms of at least their thickness between the opposite sides of the gate stack layers whereby the dielectric spacers share common sidewalls with ends of the semiconductor nanosheets while the dielectric spacers on one side of the gate stack layers are thicker than the dielectric spacers on another, opposite side of the gate stack layers, and wherein each of the dielectric spacers comprises a single layer of a spacer material.

2. The semiconductor structure of claim 1, wherein the dielectric spacers comprise:
first dielectric spacers that are adjacent to the first source/drain region and separate the first source/drain region from the gate stack layers.

3. The semiconductor structure of claim 2, wherein the dielectric spacers further comprise:
second dielectric spacers that are adjacent to the second source/drain region and separate the second source/drain region from the gate stack layers.

4. The semiconductor structure of claim 3, wherein the first and second dielectric spacers comprise high-k dielectric material.

5. The semiconductor structure of claim 1, wherein the gate stack layers comprise high-k dielectric material.

6. The semiconductor structure of claim 1, wherein the semiconductor structure forms a field effect transistor (FET) with a gate atop the gate stack layers.

7. The semiconductor structure of claim 1, wherein the first source/drain region is adjacent to and contacts both the nanosheet stack and an adjacent nanosheet stack.

8. The semiconductor structure of claim 7, wherein one side of the first source/drain region is adjacent to and contacts the nanosheet stack, and wherein another opposite side of the first source/drain region is adjacent to and contacts the adjacent nanosheet stack.

9. The semiconductor structure of claim 7, wherein the dielectric spacers that are thicker are on a different side of the nanosheet stack as compared to the adjacent nanosheet stack.

10. The semiconductor structure of claim 1, further comprising:
a first source/drain region metal contact that contacts the first source/drain region, wherein the first source/drain region metal contact is present entirely above the dielectric spacers; and
a second source/drain region metal contact that contacts the second source/drain region, wherein the second source/drain region metal contact is present entirely above the dielectric spacers.

11. A semiconductor structure comprising:
a substrate;
bottom dielectric isolation (BDI) on the substrate;
a first source/drain region on the BDI;
a nanosheet stack on the BDI, the nanosheet stack comprising:
gate stack layers;
semiconductor nanosheets interleaved with the gate stack layers and contacting the first source/drain region; and first inner spacers adjacent to the first source/drain region and separating the first source/drain region from the gate stack layers;

a second source/drain region contacting the semiconductor nanosheets and extending from the top of the nanosheet stack down through the BDI to the substrate;

a drain metal contact that contacts the first source/drain region, wherein the drain metal contact is present entirely above the first inner spacers; and a source metal contact that contacts the second source/drain region, wherein the source metal contact is present entirely above second inner spacers, wherein the nanosheet stack further comprises the second inner spacers that are adjacent to the second source/drain region and separate the second source/drain region from the gate stack layers, and wherein the first inner spacers have asymmetry in terms of at least their thickness as compared to the second inner spacers whereby the first inner spacers and the second inner spacers share common sidewalls with ends of the semiconductor nanosheets while the first inner spacers are thicker than the second inner spacers.

12. The semiconductor structure of claim 11, wherein the first inner spacers and the second inner spacers are high-k material.

13. The semiconductor structure of claim 11, further comprising:

a gate atop the nanosheet stack;

a drain metal contact that contacts the first source/drain region;

a source metal contact that contacts the second source/drain region; and first and second gate dielectric spacers that electrically separate the gate from the drain metal contact and the source metal contact, wherein the semiconductor structure forms a field effect transistor (FET).

14. The semiconductor structure of claim 13, further comprising:

a gate dielectric cap atop the gate, wherein a top of the gate dielectric cap is coplanar with tops of the first and second gate dielectric spacers.

15. The semiconductor structure of claim 11, wherein the second inner spacers are of different dielectric constant k, compared to the first inner spacers.

16. The semiconductor structure of claim 11, wherein the second inner spacers are of different width, compared to the first inner spacers.

17. The semiconductor structure of claim 11, wherein the second inner spacers have a higher k-value, compared to the first inner spacers.

18. The semiconductor structure of claim 11, wherein the first source/drain region is adjacent to and contacts both the nanosheet stack and an adjacent nanosheet stack.

19. The semiconductor structure of claim 11, wherein each of the first inner spacers and each of the second inner spacers comprises a single layer of a spacer material.

\*   \*   \*   \*   \*